(12) United States Patent
Lowe

(10) Patent No.: US 10,254,328 B1
(45) Date of Patent: Apr. 9, 2019

(54) ELECTRIC FENCE ALERT SYSTEM

(71) Applicant: Robert Alex Lowe, Kearney, NE (US)

(72) Inventor: Robert Alex Lowe, Kearney, NE (US)

( * ) Notice: Subject to any disclaimer, the term of this patent is extended or adjusted under 35 U.S.C. 154(b) by 0 days.

(21) Appl. No.: 15/889,152

(22) Filed: Feb. 5, 2018

Related U.S. Application Data

(60) Provisional application No. 62/454,344, filed on Feb. 3, 2017.

(51) Int. Cl.
*A01K 3/00* (2006.01)
*G01R 31/02* (2006.01)
*G08B 21/18* (2006.01)

(52) U.S. Cl.
CPC ............ *G01R 31/026* (2013.01); *A01K 3/005* (2013.01); *G01R 31/021* (2013.01); *G08B 21/185* (2013.01)

(58) Field of Classification Search
CPC ..................................................... G01R 31/026
USPC ......................................................... 340/650
See application file for complete search history.

(56) References Cited

U.S. PATENT DOCUMENTS

| | | | |
|---|---|---|---|
| 3,648,266 A * | 3/1972 | Crist | H05C 1/06 335/273 |
| 4,220,949 A * | 9/1980 | Pope | G08B 13/122 256/10 |
| 4,523,187 A * | 6/1985 | Begg | G01R 19/16585 256/10 |
| 8,710,983 B2 * | 4/2014 | Malkowski | G08B 13/22 340/539.1 |
| 8,810,265 B2 * | 8/2014 | Shan | G08B 13/08 256/10 |
| 9,658,257 B1 * | 5/2017 | Lunger | G01R 19/16533 |

* cited by examiner

*Primary Examiner* — Kerri L McNally
(74) *Attorney, Agent, or Firm* — Suiter Swantz pc llo

(57) ABSTRACT

An electric fence monitoring system includes a transmission unit electrically coupled to one or more portions of an electrical fence. The transmission unit includes one or more transmission devices configured to generate and transmit one or more signals in response to an electrical parameter of the electrical fence. The system includes a sensor unit positioned proximate to the transmission unit such that one or more sensors of the sensor unit remotely sense the one or more signals from the one or more transmission devices. The system includes a controller coupled to the one or more sensors. The controller is configured to to determine an operational state of the electric fence based on the one or more signals remotely sensed by the one or more sensors. The controller is configured to report the operational state of the electric fence to one or more user devices.

21 Claims, 6 Drawing Sheets ized environment within an electric fence. However, often times an electric fence, especially when used in the context of agricultural, needs to be installed to segregate a large area (e.g., spanning multiple county lines). It becomes inefficient to physically check an electric fence that covers such a large area for issues (e.g., short circuit, loss of power, and/or disconnections) on a daily basis. Therefore, it would be desirable to cure the shortcomings of the previous approaches as described above.

ELECTRIC FENCE ALERT SYSTEM

CROSS-REFERENCE TO RELATED APPLICATION

The present application claims the benefit under 35 U.S.C. § 119(e) of U.S. Provisional Application Ser. No. 62/454,344, filed Feb. 3, 2017, entitled ELECTRIC FENCE ALERT SYSTEM, naming Robert Alex Lowe as an inventor, which is incorporated herein by reference in the entirety.

TECHNICAL FIELD

The present invention generally relates to electric fences, and, in particular, to an alert system for detecting a failure in an electric fence.

BACKGROUND

An electric fence is a barrier that utilizes electricity, and the threat of electrical shock, to deter animals from moving across a boundary. An electric fence may be used in a variety of ways including agricultural fencing (e.g., livestock production, animal husbandry, and the like) and animal control (e.g., wildlife management). Typically, manual monitoring with a voltage detector is required on a daily basis in order to maintain a safe and regulated environment within an electric fence. However, often times an electric fence, especially when used in the context of agricultural, needs to be installed to segregate a large area (e.g., spanning multiple county lines). It becomes inefficient to physically check an electric fence that covers such a large area for issues (e.g., short circuit, loss of power, and/or disconnections) on a daily basis. Therefore, it would be desirable to cure the shortcomings of the previous approaches as described above.

SUMMARY

An electric fence monitoring system is disclosed, in accordance with one or more embodiments of the present disclosure. In one embodiment, the system includes monitoring circuitry, wherein the monitoring circuitry comprises a transmission unit and a sensor unit. In another embodiment, the transmission unit is electrically coupled to one or more portions of an electrical fence. In another embodiment, the transmission unit comprises one or more transmission devices configured to generate and transmit one or more signals in response to an electrical parameter of the electrical fence. In another embodiment, the sensor unit is positioned proximate to the transmission unit such that one or more sensors of the sensor unit remotely sense the one or more signals from the one or more transmission devices. In another embodiment, the system includes a controller communicatively coupled to an output of the one or more sensors, wherein the controller comprises one or more processors configured to execute a set of program instructions maintained in memory. In another embodiment, the program instructions are configured to cause the one or more processors to determine an operational state of the electric fence based on the one or more signals remotely sensed by the one or more sensors of the sensor unit and a predetermined threshold for the electrical parameter. In another embodiment, the program instructions are configured to report the operational state of the electric fence to one or more user devices.

A method for monitoring an electric fence is disclosed, in accordance with one or more embodiments of the present disclosure. In one embodiment, the method includes generating and transmitting one or more light signals in response to one or more electrical parameters of an electrical fence. In another embodiment, the method includes remotely sensing the one or more light signals. In another embodiment, the method includes determining an operational state of the electric fence based on the one or more light signals. In another embodiment, the method includes reporting the operation state of the electric fence to one or more user devices.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Reference will now be made in detail to a system for monitoring an electric fence, which is illustrated in the accompanying drawings. FIGS. 1-4 generally illustrate an electric fence monitoring system and a method of alerting a user to a malfunction in an electric fence, in accordance with one or more embodiments of the present disclosure.

Embodiments of the present disclosure are directed to monitoring an electric fence and reporting observed malfunctions, such as a change in voltage (e.g., a complete loss in voltage/power, a drop in voltage below a selected threshold, and the like), of the electric fence to a user. Embodiments of the present disclosure allow the status of an electric fence to be remotely monitored and thereby drastically reduce the frequency of manually checking the electric fence.

Figure 1:
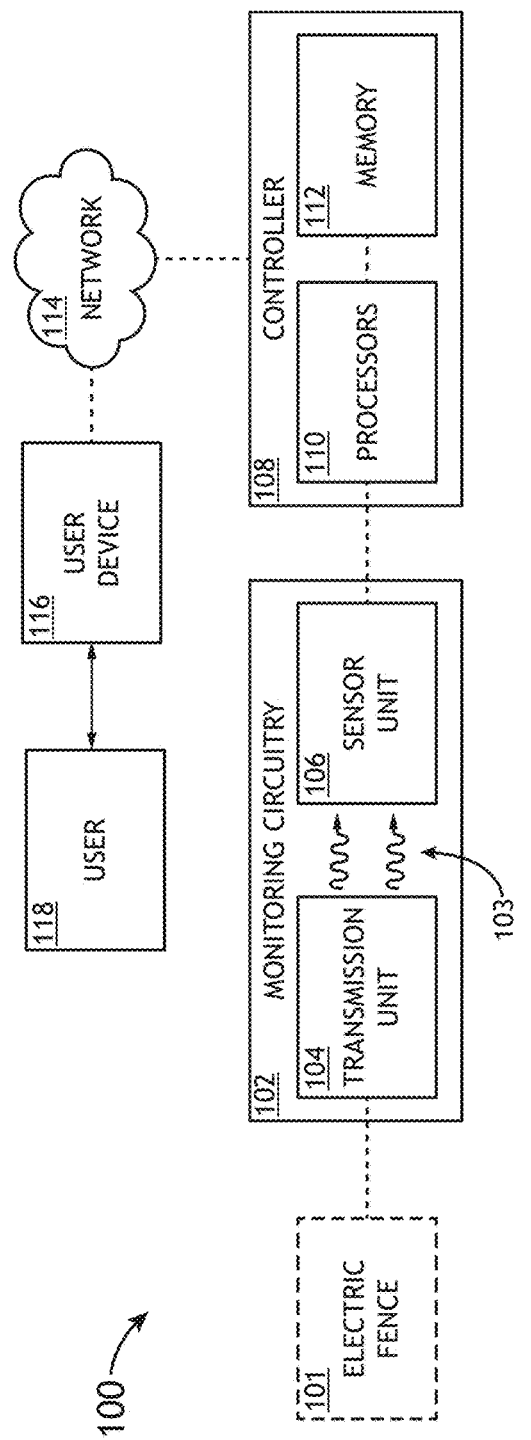
FIG. 1 illustrates a block diagram view of electric fence alert system, in accordance with one or more embodiments of the present disclosure.

FIG. 1 illustrates a block diagram view of an electric fence alert system 100, in accordance with one or more embodiments of the present disclosure. In one embodiment, the electric fence alert system 100 includes monitoring circuitry 102. In one embodiment, the monitoring circuitry 102 includes a transmission unit 104 and a sensor unit 106. In one embodiment, the transmission unit 104 is electrically couplable to an electric fence 101. In another embodiment, the transmission unit 104 includes one or more transmission devices configured to generate and transmit one or more signals 103 in response to an electrical parameter of the electric fence 101. For example, the one or more transmission devices may include one or more optical devices (e.g., light emitting device), an induction device (e.g., one or more induction coils), an audio device (e.g., acoustic transducer) and/or a magnetic device (e.g., electromagnet) which serve to generate one or more signals in response to one or more electrical parameters (e.g., voltage, current, power, etc.) of the electric fence 101.

In another embodiment, the sensor unit 106 includes one or more sensors. The sensor unit 106 may be positioned proximate to, but not in mechanical or electrical contact with, the transmission device(s) of the transmission unit 104. In this regard, the one or more sensors of the sensor unit 106 are configured to remotely sense the signal or signals 103 transmitted by the transmission unit 104. It is noted that such a configuration provides for electrical isolation between the electric fence 101 and the sensor unit 106 and all circuitry downstream from the sensor unit 106.

In another embodiment, the system 100 includes a controller 108. The controller 108 may include one or more processors 110 and memory 112. In one embodiment, the one or more processors 110 are configured to execute a set of program instructions maintained in memory 112. In another embodiment, the one or more program instructions are configured to cause the one or more processors to determine an operational state of the electric fence 101 based on the one or more signals remotely sensed by the one or more sensors of the sensor unit 106 and a predetermined threshold for the electrical parameter. For example, the one or more processors 110 may determine whether the electric fence 101 is operating within desired parameters by determining whether the measured voltage of the fence 101 is within a predetermined or preselected threshold voltage. In another embodiment, the one or more program instructions are configured to cause the one or more processors to report the operational state of the electric fence to one or more user devices 116. For example, the one or more processors 110 may transmit one or more signals or messages (e.g., SMS message, message through mobile application, popup notification on mobile device, audio message or alert, and the like) to the one or more user devices 116 via network 114. In this regard, the one or more processors 110 may inform a user 118 of a given user device 116 of the status of the electric fence or alert the user 118 when the fence 101 is malfunctioning or operating outside of the predetermined threshold.

The one or more user devices 116 may include any user device known in the art. For example, the one or more user devices 116 may include, but are not one or more mobile communication devices (e.g., smartphone, tablet, PDA, laptop, ultrabook, smartwatch, etc.), one or more computers (e.g., personal computer), and/or one or more servers.

The term "processor" may be broadly defined to encompass any device having one or more processing elements, which execute program instructions from a non-transitory memory. In one embodiment, the one or more processors 110 may include any microprocessor-type computational device configured to execute software algorithms and/or instructions. The term "computational device" may be broadly defined to encompass any device having data processing or logic capabilities. It should be recognized that the steps described throughout the present disclosure may be carried out by a single controller or, alternatively, multiple controllers. It is further recognized that a portion of the various steps performed throughout the present disclosure may be carried out on a remote server coupled to the controller 108 and/or the monitoring circuitry 102 via network 114. The memory 112 may include any storage medium known in the art suitable for storing program instructions executable by the associated one or more processors and/or for storing one or more databases (e.g., database containing results or thresholds). For example, the memory may include, but is not limited to, random access memory (RAM), read-only memory (ROM), or a persistent store, such as a mass storage device, hard drives, CDROM, DVDROM, tape, erasable programmable read-only memory (EPROM or flash memory), any magnetic, electromagnetic, solid state, infrared, optical, or electrical system, apparatus or device for storing information, or any other type of media suitable for storing electronic data.

Figure 2A:
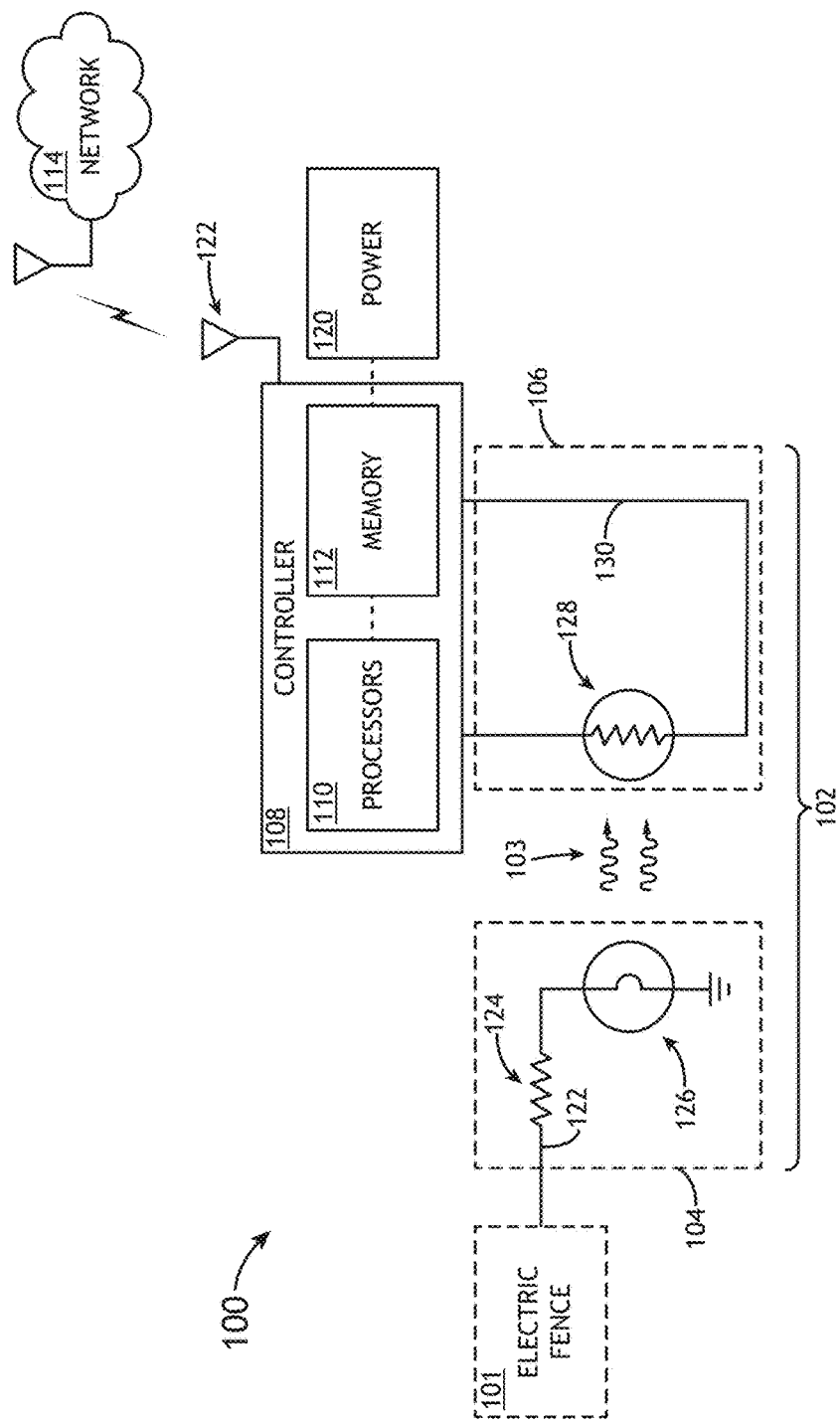
FIG. 2A illustrates a conceptual view of the electric fence alert system, in accordance with one or more embodiments of the present disclosure.

FIG. 2A illustrates a block-diagram view the electric fence alert system 100 utilizing an optical isolation approach, in accordance with one or more embodiments of the present disclosure.

In one embodiment, the transmission unit 104 of the monitoring circuitry 102 includes a first electric wire 122 which connects the electric fence 101 to the electric fence alert system 100. For example, the first electric wire 102 may be a high-voltage wire that couples the transmission unit 104 of the system 100 to the voltage of the electric fence 101. By way of another example, the first electric wire 102 that connects the electric fence alert system 100 to the electric fence 100 may be a high-voltage wire surrounded by insulation. It is noted that any high-voltage wire known in the art may be used as the first electric wire 102.

In one embodiment, the first electric wire 102 of the electric fence alert system 100 may be connected to an electrically active portion of the electric fence 150. For example, the first electric wire 102 of the electric fence alert system 100 may be connected to an electric wire of the electric fence 101 by a conductive clip or clamp. By way of another example, the first electric wire 102 of the electric fence alert system 100 may be plugged into an energizer (e.g., see FIG. 3) coupled to the electric fence 101. By way of another example, the first electric wire 102 of the electric fence alert system 100 may be configured with a hook portion to allow the wire to be hung from the electric fence 101. By way of another example, the first electric wire 102 of the electric fence alert system 100 may be connected to the first electric wire 102 of the electric fence 150 by soldering. It is noted that the coupling mechanism of the transmission unit 104 to one or more portions of the electric fence 101 is not limited to the examples provided above, which are provided merely for illustrative purposes. Rather, the scope of the present disclose should be interpreted to extend to any device, components and methodology for electrically and/or mechanically coupling the electric fence to the transmission unit 104.

In another embodiment, the transmission unit 104 of the monitoring circuitry 102 includes a resistor 104 that is electrically coupled to the first electric wire 102. For example, the resistor 104 of the electric fence alert system 100 may be a fixed value resistor that drops voltage across the resistor by a predetermined amount. By way of another example, the resistor 104 of the electric fence alert system 100 may be a variable value resistor that lowers the voltage by an adjustable amount. In another embodiment, an end of the first electric wire 102 of the electric fence alert system 100 is connected to ground 108.

It is noted that, although one resistor 104 is depicted in FIG. 2A, such a configuration is merely provided for illustrative purposes. Embodiments of the present disclosure may be configured to include any number of resistors or additional circuitry elements (e.g., capacitors, switches, and etc.) necessary to condition the electrical output (e.g., lower voltage) from electric fence 101 to the electric fence alert system 100.

In another embodiment, the one or more transmission devices of the transmission unit 104 of electric fence alert system 100 include a light-emitting device 126 that is electrically coupled to the first electric wire 102 and is placed between the resistor 104 and ground 108 (e.g., earth, common reference point). For example, the light-emitting device 120 of the electric fence alert system 100 may include any light-emitting device known in the art, such as, but not limited to, an LED, a lamp, a laser and the like, which emits light in response to an applied voltage. In the case of where the light-emitting device is a lamp, the lamp may include, but is not limited to, a neon lamp (e.g., NE-2 neon bulb), argon lamp, krypton lamp, xenon lamp, helium lamp, nitrogen lamp, oxygen lamp, water vapor lamp, carbon dioxide lamp, mercury vapor lamp, sodium vapor lamp, hydrogen lamp, and the like.

In another embodiment, the sensor unit 106 includes one or more light-sensitive sensors 128. For example, the one or more sensors 128 of the sensor unit 106 may include, but are not limited to, a photoresistor 128 positioned in such a way that it detects light transmitted from the light-emitting device 126. For example, the photoresistor may be any photoresistor known in the art capable of varying an electric resistance as a function of received light intensity. For instance, the photoresistor may include, but is not limited to, one or more CdS, CdSe, PbS, PbMn, or InSb photoresistor. The photoresistor may decrease in electrical resistance with increasing incident light intensity from the light-emitting device 126. In this regard, the photoresistor of the sensor unit 106 of electric fence alert system 100 allows for detecting and monitoring light intensity of the light-emitting device 126 by monitoring changes (increase and/or decrease) in the electrical resistance of the photoresistor via second electric wire 112. In this embodiment, the value or state of one or more electrical parameters of the electric fence 101 may be monitored indirectly by monitoring the intensity of light emitted by the light-emitting device 126, which is proportional to the voltage from the electric fence 101.

It is noted that the one or more sensors 128 of the sensor unit 106 are not limited to a photoresistor, which is provided merely for illustrative purposes. For example, the one or more sensors 128 may include any light-detecting known in the art, such as, but not limited to, one or more photovoltaic cells, one or more photodiodes, one or more CCDs, one or more PMTs, and the like.

In another embodiment, the controller 108 may maintain a database in order to correlate intensity measurements acquired with the one or more sensors 128 and the state/value of the one or more electrical parameters (e.g., voltage) of the electric fence 101. For example, a look-up table may be established that correlates a given intensity value measured with the sensor 128 (intensity itself is found by correlating the voltage or other electrical signal from the sensor 128) to a corresponding voltage on the electric fence 101. Such a table may be constructed by measuring the intensity of the light 103 at the sensor 128 for a number of fence voltages.

It is note that, while the light-emitting device 126 and the sensor 128 of the electric fence alert system 100 are depicted as physically separate units, such a configuration is merely provided for illustrative purposes. For example, the light-emitting device 126 and the sensor 128 may be configured in a single unit, whereby the physical separation between the light-emitting device 126 and the sensor 128 is minimized. Even further, the system 100 may include one or more optical fibers or optical fiber bundles, which optically couple the output 103 of the light-emitting device 126 and the one or more sensors 128. Such an arrangement maintains electrical isolation between the transmission unit 104 and the sensor unit 106.

It is further noted that the transmission unit 104 and sensor unit 106 are not limited to the light-emitting device/light sensor arrangement depicted in FIG. 2A. Any number of technologies capable of transmitting/receiving a wireless signal may be incorporated within the scope of the present disclosure. For example, the transmission unit 104 may include an induction coil configured to inductively couple to a corresponding induction coil of the sensor unit 106, a pair of induction coils. By way of another example, the transmission unit 104 may include an electromagnet device, which may be sensed by a device sensitive to magnetic fields (e.g., magnetometer) in the sensor unit 106. By way of another example, the transmission unit 104 may include a microwave emitter configured to transmit microwave radiation to a microwave sensor/detector in the sensor unit 106. By way of another example, the transmission unit 104 may include an RF emitter configured to transmit RF radiation to an RF sensor/detector in the sensor unit 106.

In another embodiment, the controller 108 is electrically coupled to the sensor 128 via the second electric wire 112. The controller 108 may include any module or board known in the art capable of receiving an output from the sensor 128, determining one or more electrical parameters of the electric fence 101 based on the output, and reporting the operation state of the electric fence 101 to a user device.

In one embodiment, the controller 108 may include network interface circuitry and antenna 122 configured for communicatively coupling the controller 108 to one or more user devices 116 and/or a server (not shown). In this regard, the controller 108 may include a network interface device suitable for interfacing with network 114, while the user device 116 and/or server include a network interface device also suitable for interfacing with network 114. The network interface devices may include any network interface device known in the art. For instance, the network interface devices may include wireline-based interface devices (e.g., DSL-based interconnection, Cable-based interconnection, T9-based interconnection, and the like). In another instance, the network interface devices may include a wireless-based interface device employing GSM, GPRS, CDMA, EV-DO, EDGE, WiMAX, LTE, Wi-fi protocols, and the like.

In one embodiment, the controller 108 may include a FONA circuit board. In another embodiment, the program instructions are configured to cause the one or more processors 110 to send a message (e.g., short message service (SMS)) to a user device 116 via network 114. It is noted that the controller 108 may be equipped with voice, text, SMS, and data capabilities.

In another embodiment, the controller 108 of the electric fence alert system 100 is configured to cause the one or more processors 110 to send a message to notify the user when the voltage of the electric fence drops below a selected threshold. For example, the selected threshold may be set at 5.00 kilovolts (kV). More specifically, the selected threshold of the power may be set at 3.75 kV. In this example, when the voltage of the fence 101 drops below the selected threshold, as measured via the monitoring circuitry 102 and controller 108, the controller 108 may transmit a message, alert, or signal to the user device 116. It is noted that the threshold of the voltage drop may be selected based on the user's preference.

In another embodiment, the controller 108 of the electric fence alert system 100 is configured to cause the one or more processors 110 to send a message immediately to notify the user when the voltage of the electric fence varies beyond a selected threshold or range. In another embodiment, the controller 108 of the electric fence alert system 100 is configured to cause the one or more processors 110 to send a message at periodic intervals (e.g., a set daily time) to notify the user of a current status of the electric fence 101. For example, when the electric fence 101 is operating normally the controller 108 may transmit a message to the user device 116 at a selected interval regarding the status of the electric fence 101.

In another embodiment, the controller 108 of the electric fence alert system 100 is configured to track the current passing through the electric fence and/or the electric fence alert system 100. It is noted that the electric fence energizer sends a high-voltage pulse to the fence and current passes through the fence when the fence is coupled to ground by a conductor or in other words when someone or something is in contact with the high-voltage wire of the electric fence 101 and ground at the same time as a high-voltage pulse is sent through the high-voltage wire.

In one embodiment, in the case of a photoresistor-based sensor 128, the controller 108 of the electric fence alert system 100 may monitor a change in the electrical resistance of the photoresistor to identify a voltage change in the first electric wire 102 (i.e., a voltage of the electric fence) based on an intensity of the light-emitting device 126. In turn, the controller 108 may generate and send appropriate messages to a user device 116 based on an electrical resistance of the photoresistor outside of a predetermined or selected resistance.

In another embodiment, as shown in FIG. 2A, the controller 108 of the electric fence alert system 100 is coupled to a power source 120. For example, the power source 120 may be an external power source supplying power to the electric fence alert system 100. For instance, the external power source of the electric fence alert system 100 may include, but is not limited to, grid power, solar power, wind power, hydroelectric power, and/or nuclear power.

Figure 2B:
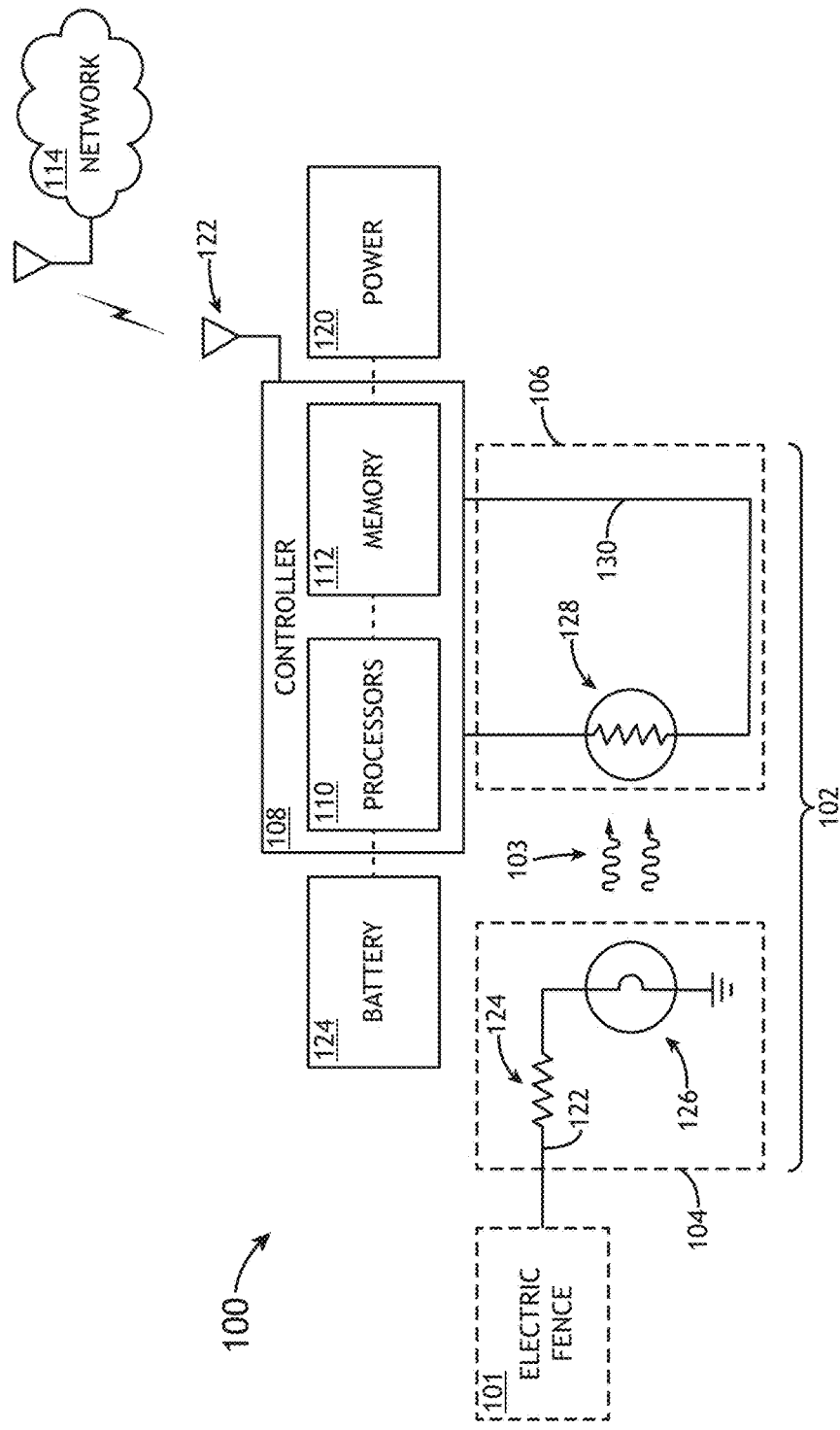
FIG. 2B illustrates a conceptual view of the electric fence alert system equipped with a battery, in accordance with one or more embodiments of the present disclosure.

In one embodiment, as shown in FIG. 2B, the controller 108 of the electric fence alert system 100 is coupled to an internal battery 124 which may be recharged by the power source 120. For example, the internal battery 124 of the electric fence alert system 100 may supply power to the controller 108 when the power source 120 is in operable (e.g., blackout). It is noted that the internal battery 124 may include any rechargeable battery known in the art including, but not limited to, one or more lithium ion batteries, lead-acid batteries, nickel cadmium batteries, nickel metal hydride batteries, and/or lithium ion polymer batteries.

Figure 2C:
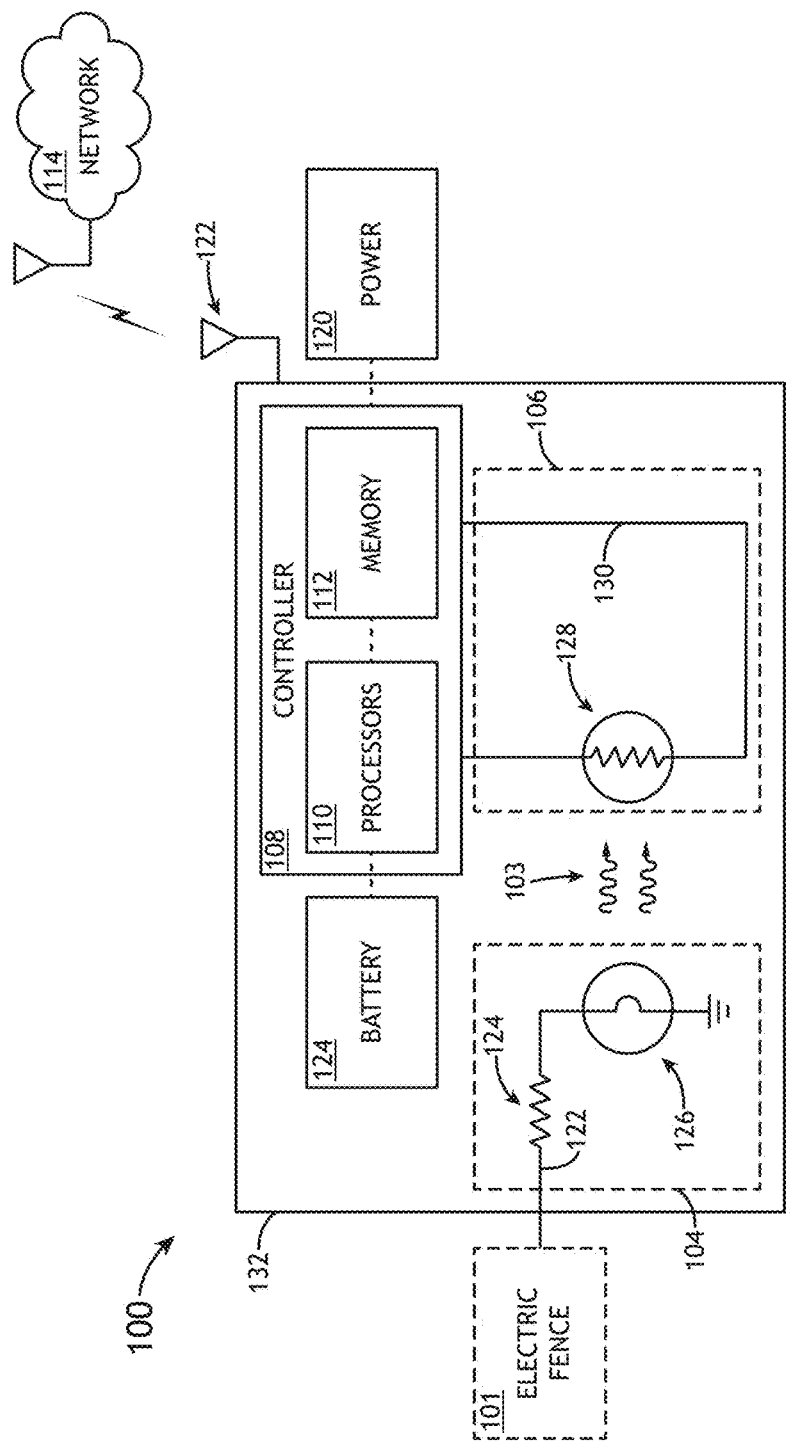
FIG. 2C illustrates a conceptual view of the electric fence alert system disposed within a container, in accordance with one or more embodiments of the present disclosure.

In another embodiment, as shown in FIG. 2C, the electric fence alert system 100 may be disposed within a container 132. For example, the container 132 may include, but is not limited to, a water proof case configured to provide moisture control for electric fence alert system 100.

Figure 3:
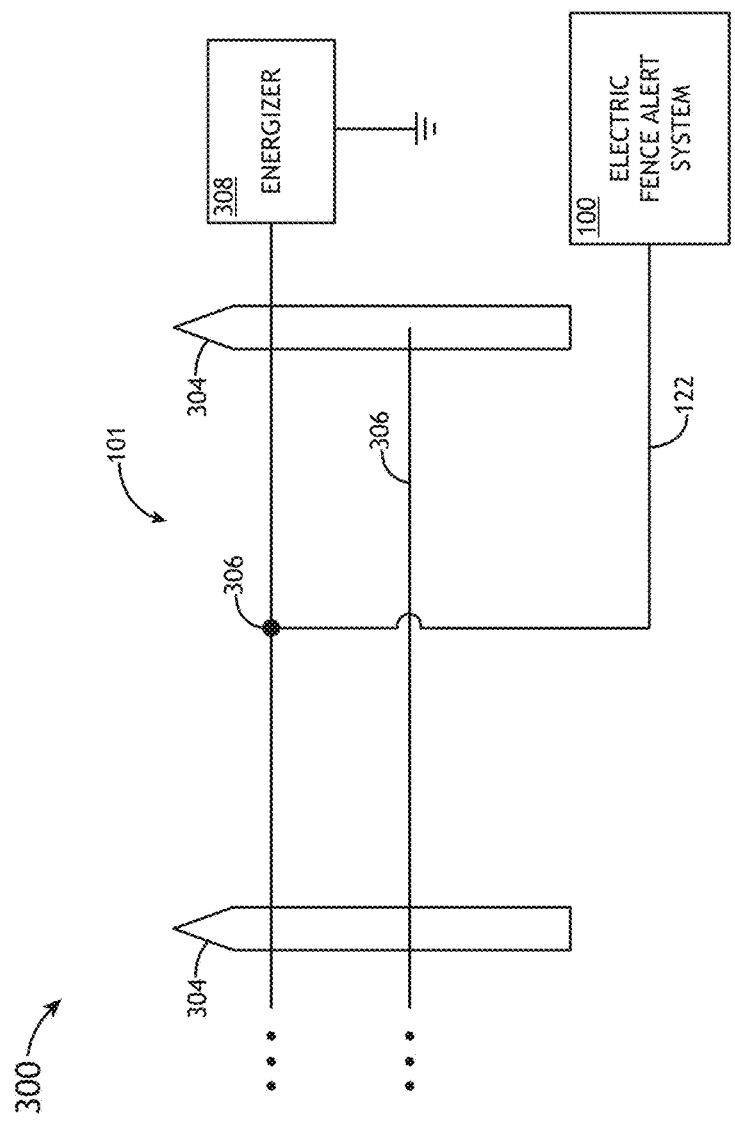
FIG. 3 illustrates a conceptual view of the electric fence alert system installed on an electric fence, in accordance with one or more embodiments of the present disclosure.

FIG. 3 illustrates a conceptual view of an implementation of the electric fence alert system 100, in accordance with one or more embodiments of the present disclosure. In this embodiment, an electric fence assembly 300 includes the electric fence 100 installed along a boundary and the electric fence alert system 100. For example, the electric fence 101 may include fence posts 304 and electric fence wires 306. In another embodiment, the electric fence alert assembly 300 includes a fence energizer 308 to provide power to the electric fence wires 306 of the electric fence 101.

In one embodiment, as discussed throughout the present disclosure, the electric fence alert system 100 is couplable to the electric fence 101. For example, wire 122 of the electric fence alert system 100 may be coupled to one or more of the electric fence wires 306 of the electric fence 101. It is noted that the wire 122 of the electric fence alert system 100 may be coupled to one or more wires 306 of the electric fence 101 by soldering, by a conductive clip, by direct plug, or by hanging on the electric fence wires 306 and/or the fence energizer 308 of the electric fence 101.

It is contemplated that, while one fence energizer is depicted in FIG. 3, such a configuration is merely provided for illustrative purposes. Embodiments of the present disclosure may be adapted to include more than one fence energizer 308 to supply power to the electric fence 101. It is further contemplated that, while one electric fence alert system 100 is coupled to the electric wire 306 of the electric fence 101, such a configuration is merely provided for illustrative purposes. Embodiments of the present disclosure may adapt multiple electric fence alert systems 100 installed along the electric fence 101. It is further contemplated that, while the wire 122 of the electric fence alert system 100 is depicted to be coupled to the lower electric wire 306 of the electric fence 101 in FIG. 3, such a configuration is merely provided for illustrative purposes. Embodiments of the present disclosure may allow the user to select a location for coupling the wire 122 of the electric fence alert system 100 with the electric wire 306 of the electric fence 101.

It is contemplated that one or more sets of the electric fence alert system 100 may be used to monitor one or more sections of the electric fence 100 status at the same time and send messages to the user's phone based on corresponding voltage drops of the one or more sections of the electric fence 100.

Although examples in the present disclosure have generally been directed toward agricultural purposes, it is to be understood that embodiments of the present disclosure may be extended to non-agricultural purposes. It is further noted herein that embodiments of the present disclosure may be extended to any system that requires electricity for operation. As such, the scope of the present disclosure is not limited to the context of an electric fence and may be extended to any system or device that requires a conductive electrical line. For example, the alert system of the present disclosure may be implemented in the context of power lines and the like.

Figure 4:
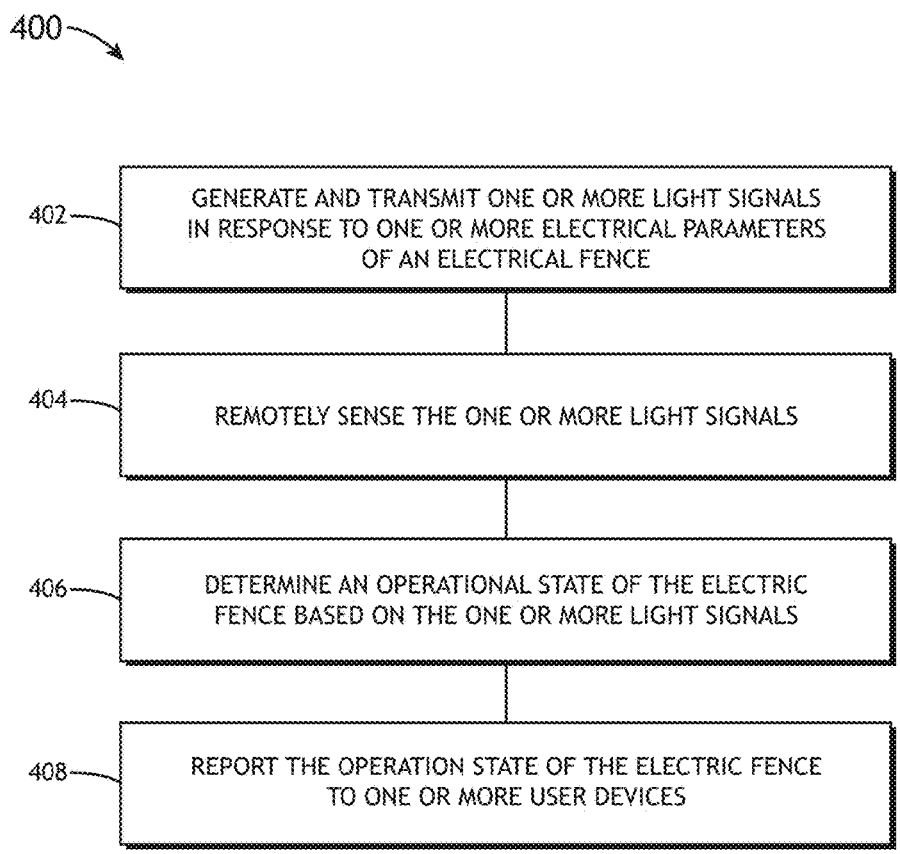
FIG. 4 illustrates a process flow diagram depicting a method of alerting a user to a malfunction of an electric fence, in accordance with one or more embodiments of the present disclosure.

FIG. 4 illustrates a process flow diagram depicting a method of alerting a user to a malfunction of an electric fence, in accordance with one or more embodiments of the present disclosure.

In step 402, the method includes generating and transmitting one or more light signals in response to one or more electrical parameters of an electrical fence. In step 404, the method includes remotely sensing the one or more light signals. In step 406, the method includes determining an operational state of the electric fence based on the one or more light signals. In step 408, the method includes reporting the operation state of the electric fence to one or more user devices.

All of the steps described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, etc. Furthermore, the results may be stored "permanently," "semi-permanently," temporarily, or for some period of time. For example, the memory may be random access memory (RAM), and the results may not necessarily persist indefinitely in the memory Those having skill in the art will recognize that the state of the art has progressed to the point where there is little distinction left between hardware, software, and/or firmware implementations of aspects of systems; the use of hardware, software, and/or firmware is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

In some implementations described herein, logic and similar implementations may include software or other control structures. Electronic circuitry, for example, may have one or more paths of electrical current constructed and arranged to implement various functions as described herein. In some implementations, one or more media may be configured to bear a device-detectable implementation when such media hold or transmit device-detectable instructions operable to perform as described herein. In some variants, for example, implementations may include an update or modification of existing software or firmware, or of gate arrays or programmable hardware, such as by performing a reception of or a transmission of one or more instructions in relation to one or more operations described herein. Alternatively or additionally, in some variants, an implementation may include special-purpose hardware, software, firmware components, and/or general-purpose components executing or otherwise invoking special-purpose components. Specifications or other implementations may be transmitted by one or more instances of tangible transmission media as described herein, optionally by packet transmission or otherwise by passing through distributed media at various times.

Alternatively or additionally, implementations may include executing a special-purpose instruction sequence or invoking circuitry for enabling, triggering, coordinating, requesting, or otherwise causing one or more occurrences of virtually any functional operations described herein. In some variants, operational or other logical descriptions herein may be expressed as source code and compiled or otherwise invoked as an executable instruction sequence. In some contexts, for example, implementations may be provided, in whole or in part, by source code, such as C++, or other code sequences. In other implementations, source or other code implementation, using commercially available and/or techniques in the art, may be compiled/implemented/translated/converted into a high-level descriptor language (e.g., initially implementing described technologies in C or C++ programming language and thereafter converting the programming language implementation into a logic-synthesizable language implementation, a hardware description language implementation, a hardware design simulation implementation, and/or other such similar mode(s) of expression). For example, some or all of a logical expression (e.g., computer programming language implementation) may be manifested as a Verilog-type hardware description (e.g., via Hardware Description Language (HDL) and/or Very High Speed Integrated Circuit Hardware Descriptor Language (VHDL)) or other circuitry model which may then be used to create a physical implementation having hardware (e.g., an Application Specific Integrated Circuit). Those skilled in the art will recognize how to obtain, configure, and optimize suitable transmission or computational elements, material supplies, actuators, or other structures in light of these teachings.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

In a general sense, those skilled in the art will recognize that the various embodiments described herein can be implemented, individually and/or collectively, by various types of electro-mechanical systems having a wide range of electrical components such as hardware, software, firmware, and/or virtually any combination thereof; and a wide range of components that may impart mechanical force or motion such as rigid bodies, spring or torsional bodies, hydraulics, electro-magnetically actuated devices, and/or virtually any combination thereof. Consequently, as used herein "electro-mechanical system" includes, but is not limited to, electrical circuitry operably coupled with a transducer (e.g., an actuator, a motor, a piezoelectric crystal, a Micro Electro Mechanical System (MEMS), etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, flash, read only, etc.)), electrical circuitry forming a communications device (e.g., a modem, communications switch, optical-electrical equipment, etc.), and/or any non-electrical analog thereto, such as optical or other analogs. Those skilled in the art will also appreciate that examples of electro-mechanical systems include but are not limited to a variety of consumer electronics systems, medical devices, as well as other systems such as motorized transport systems, factory automation systems, security systems, and/or communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, and/or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of memory (e.g., random access, serial access, flash, read only, etc.)), and/or electrical circuitry forming a communications device (e.g., a modem, communications switch, optical-electrical equipment, etc.). Those having skill in the art will recognize that the subject matter described herein may be implemented in an analog or digital fashion or some combination thereof.

Those skilled in the art will recognize that at least a portion of the devices and/or processes described herein can be integrated into a data processing system. Those having skill in the art will recognize that a data processing system generally includes one or more of a system unit housing, a video display device, memory such as volatile or non-volatile memory, processors such as microprocessors or digital signal processors, computational entities such as operating systems, drivers, graphical user interfaces, and applications programs, one or more interaction devices (e.g., a touch pad, a touch screen, an antenna, etc.), and/or control systems including feedback loops and control motors (e.g., feedback for sensing position and/or velocity; control motors for moving and/or adjusting components and/or quantities). A data processing system may be implemented utilizing suitable commercially available components, such as those typically found in data computing/communication and/or network computing/communication systems.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

Although a user is shown/described herein as a single illustrated figure, those skilled in the art will appreciate that the user may be representative of a human user, a robotic user (e.g., computational entity), and/or substantially any combination thereof (e.g., a user may be assisted by one or more robotic agents) unless context dictates otherwise. Those skilled in the art will appreciate that, in general, the same may be said of "sender" and/or other entity-oriented terms as such terms are used herein unless context dictates otherwise.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

In some instances, one or more components may be referred to herein as "configured to," "configurable to," "operable/operative to," "adapted/adaptable," "able to," "conformable/conformed to," etc. Those skilled in the art will recognize that such terms (e.g., "configured to") can generally encompass active-state components and/or inactive-state components and/or standby-state components, unless context requires otherwise.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

What is claimed:

1. A system comprising:
monitoring circuitry, wherein the monitoring circuitry comprises a transmission unit and a sensor unit,
wherein the transmission unit is electrically coupled to one or more portions of an electrical fence, wherein the transmission unit comprises one or more transmission devices configured to generate and transmit one or more signals in response to an electrical parameter of the electrical fence,
wherein the sensor unit is positioned proximate to the transmission unit such that one or more sensors of the sensor unit remotely sense the one or more signals from the one or more transmission devices; and
a controller communicatively coupled to an output of the one or more sensors, wherein the controller comprises one or more processors configured to execute a set of program instructions maintained in memory, wherein the program instructions are configured to cause the one or more processors to:
determine an operational state of the electric fence based on the one or more signals remotely sensed by the one or more sensors of the sensor unit and a predetermined threshold for the electrical parameter; and
report the operational state of the electric fence to one or more user devices.

2. The system of claim 1, wherein the one or more transmission devices comprise one or more light-emitting devices.

3. The system of claim 2, wherein the one or more light-emitting devices comprise at least one of a lamp, a light-emitting diode (LED), or a laser.

4. The system of claim 3, wherein the lamp comprises at least one of a neon lamp, an argon lamp, a krypton lamp, a xenon lamp, a helium lamp, a nitrogen lamp, an oxygen lamp, a water vapor lamp, a carbon dioxide lamp, a mercury lamp, a sodium vapor lamp, or a hydrogen lamp.

5. The system of claim 2, wherein the one or more sensors comprise one or more optical sensors.

6. The system of claim 5, wherein the one or more sensors comprise one or more optical sensors, wherein the one or more light-emitting devices are coupled to the one or more optical sensors via one or more optical fibers.

7. The system of claim 5, wherein the one or more optical sensors comprises at least one of a photoresistor, a photodiode, or a photovoltaic cell.

8. The system of claim 1, wherein the user device comprises at least one of a mobile device, a computer, or a server.

9. The system of claim 1, wherein the monitoring circuitry and the controller are contained within a common container.

10. The system of claim 1, wherein the mobile device comprises at least one of a smartphone, a smartwatch, a table, a laptop, an ultrabook, or a personal digital assistant (PDA).

11. The system of claim 1, wherein the controller is configured to report the operational state of the electric fence to one or more user devices via at least one of a text message, an audio message, or a graphical indicator.

12. The system of claim 1, wherein the electrical parameter of the electric fence comprises voltage.

13. A system comprising:
monitoring circuitry, wherein the monitoring circuitry comprises a transmission unit and a sensor unit,
wherein the transmission unit is electrically coupled to one or more portions of an electrical fence, wherein the transmission unit comprises one or more light-emitting devices configured to generate and transmit one or more light signals in response to a voltage of the electrical fence,
wherein the sensor unit is positioned proximate to the transmission unit such that one or more optical sensors of the sensor unit remotely sense the one or more light signals from the one or more light-emitting devices; and
a controller communicatively coupled to an output of the one or more optical sensors, wherein the controller comprises one or more processors configured to execute a set of program instructions maintained in memory, wherein the program instructions are configured to cause the one or more processors to:
determine an operational state of the electric fence based on the one or more light signals remotely sensed by the one or more optical sensors of the sensor unit; and
report the operational state of the electric fence to one or more user devices.

14. The system of claim 13, wherein the one or more light-emitting devices comprise at least one of a lamp, a light-emitting diode (LED), or a laser.

15. The system of claim 14, wherein the lamp comprises at least one of a neon lamp, an argon lamp, a krypton lamp, a xenon lamp, a helium lamp, a nitrogen lamp, an oxygen lamp, a water vapor lamp, a carbon dioxide lamp, a mercury lamp, a sodium vapor lamp, or a hydrogen lamp.

16. The system of claim 13, wherein the one or more light-emitting devices are coupled to the one or more optical sensors via one or more optical fibers.

17. The system of claim 13, wherein the one or more optical sensors comprises at least one of a photoresistor, a photodiode, or a photovoltaic cell.

18. The system of claim 13, wherein the user device comprises at least one of a mobile device, a computer, or a server.

19. The system of claim 13, wherein the monitoring circuitry and the controller are contained within a common container.

20. The system of claim 13, wherein the controller is configured to report the operational state of the electric fence to one or more user devices via at least one of a text message, an audio message, or a graphical indicator.

21. A method comprising:
generating and transmitting one or more light signals in response to one or more electrical parameters of an electrical fence;
remotely sensing the one or more light signals;
determining an operational state of the electric fence based on the one or more light signals; and
reporting the operation state of the electric fence to one or more user devices.

* * * * *